(12) United States Patent
Kim et al.

(10) Patent No.: US 12,324,136 B2
(45) Date of Patent: Jun. 3, 2025

(54) ELECTRONIC DEVICE INCLUDING CONTACT STRUCTURE OF CAMERA MODULE

(71) Applicant: Samsung Electronics Co., Ltd., Suwon-si (KR)

(72) Inventors: Jihyun Kim, Suwon-si (KR); Kyungho Bae, Suwon-si (KR); Yonggwan Kim, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 75 days.

(21) Appl. No.: 18/184,282

(22) Filed: Mar. 15, 2023

(65) Prior Publication Data
US 2023/0292479 A1   Sep. 14, 2023

Related U.S. Application Data

(63) Continuation of application No. PCT/KR2021/012720, filed on Sep. 16, 2021.

(30) Foreign Application Priority Data

Sep. 22, 2020 (KR) .......... 10-2020-0122096
Apr. 7, 2021 (KR) .......... 10-2021-0045019

(51) Int. Cl.
*H05K 9/00*   (2006.01)
*H04M 1/02*   (2006.01)
(Continued)

(52) U.S. Cl.
CPC ........ *H05K 9/0067* (2013.01); *H04M 1/0264* (2013.01); *H04N 23/52* (2023.01); *H04N 23/57* (2023.01)

(58) Field of Classification Search
CPC .......... H05K 9/0067; H04M 1/0264; H04M 1/0283; H04N 23/52; H04N 23/57
See application file for complete search history.

(56) References Cited

U.S. PATENT DOCUMENTS 8,103,160 B2 * 1/2012 Liang ............... H04N 23/51
                                                  396/535
8,654,084 B2    2/2014 Hong et al.
(Continued)

FOREIGN PATENT DOCUMENTS

CN   101174848 A   5/2008
CN   107454295 A   12/2017
(Continued)

OTHER PUBLICATIONS

Search Report issued in European Patent Application No. 21872835.0; Application Filing Date Sep. 16, 2021; Date of Mailing Jan. 4, 2024 (10 pages).
(Continued)

*Primary Examiner* — Ahmed A Berhan
(74) *Attorney, Agent, or Firm* — CANTOR COLBURN LLP

(57) ABSTRACT

An electronic device is provided according to various embodiments of the present disclosure. The electronic device includes a housing including a rear plate having an opening and a support bracket at least partially disposed along an edge of the rear plate; a camera decoration disposed in the opening to be exposed to the outside, covering a camera assembly and connected to rear plate; a printed circuit board disposed in the housing; a rear structure supporting the camera assembly and the printed circuit board; a fixing member coupled to the rear structure and fixing the camera assembly and/or the printed circuit board to the support bracket; and a conductive member at least partially disposed between the camera decoration and the
(Continued)

fixing member to electrically connect the camera decoration and the fixing member to each other.

20 Claims, 9 Drawing Sheets

(51) Int. Cl.
  *H04N 23/52* (2023.01)
  *H04N 23/57* (2023.01)

(56) References Cited

U.S. PATENT DOCUMENTS

| | | | |
|---|---|---|---|
| 9,578,758 | B2 | 2/2017 | Mo et al. |
| 9,774,766 | B2 * | 9/2017 | Park ................. H04N 23/57 |
| 9,807,919 | B2 | 10/2017 | Kwong |
| 10,631,448 | B2 | 4/2020 | Ryu et al. |
| 12,052,488 | B2 | 7/2024 | Dong |
| 2008/0102351 | A1 | 5/2008 | Lee |
| 2011/0229119 | A1 | 9/2011 | Liang |
| 2015/0366110 | A1 | 12/2015 | Park et al. |
| 2017/0263998 | A1 | 9/2017 | Park et al. |
| 2019/0058814 | A1 | 2/2019 | Jung et al. |
| 2020/0021721 | A1 | 1/2020 | Chen et al. |

FOREIGN PATENT DOCUMENTS

| | | |
|---|---|---|
| CN | 107493420 A | 12/2017 |
| CN | 107707794 A | 2/2018 |
| CN | 207151020 U | 3/2018 |
| CN | 108566461 A | 9/2018 |
| CN | 108881681 A | 11/2018 |
| CN | 108990243 A | 12/2018 |
| CN | 208445605 U | 1/2019 |
| CN | 107547787 B | 8/2019 |
| CN | 112291450 A | 1/2021 |
| EP | 3340588 A1 | 6/2018 |
| JP | 2011097158 A | 5/2011 |
| JP | 2011199844 A | 10/2011 |
| JP | 2018074519 A | 5/2018 |
| KR | 200373718 Y1 | 1/2005 |
| KR | 100640795 B1 | 11/2006 |
| KR | 100819281 B1 | 4/2008 |
| KR | 20170036531 A | 4/2017 |
| KR | 20190020533 A | 3/2019 |
| KR | 20200055918 A | 5/2020 |
| KR | 20200101240 A | 8/2020 |
| KR | 102503223 B1 | 2/2023 |

OTHER PUBLICATIONS

International Search Report with Written Opinion for International Application No. PCT/KR2021/012720; Application Filing Date Sep. 16, 2021; Date of Mailing Dec. 28, 2021 (9 pages).

Chinese Office Action Issued In CN Patent Application No. 202180064426.1, Issue Date Apr. 3, 2025, 19 Pages.

* cited by examiner

ELECTRONIC DEVICE INCLUDING CONTACT STRUCTURE OF CAMERA MODULE

CROSS-REFERENCE TO RELATED APPLICATION(S)

This application is a continuation application, claiming priority under § 365(c), of International Application No. PCT/KR2021/012720, filed on Sep. 16, 2021, which is based on and claims the benefit of Korean patent application number 10-2021-0045019, filed on Apr. 7, 2021, and Korean patent application number 10-2020-0122096, filed on Sep. 22, 2020, in the Korean Intellectual Property Office, the disclosures of which are incorporated by reference herein in their entireties.

TECHNICAL FIELD

Various embodiments of the disclosure relate to a contact structure of a camera module for improving an electrostatic discharge (ESD) and an electronic device comprising the camera module.

BACKGROUND ART

Due to recent remarkable developments in information communication and semiconductor technologies, the dissemination and utilization of various electronic devices are rapidly increasing. In particular, recent electronic devices have been developed to enable communication while being carried.

Electronic devices may refer to devices that perform specific functions based on embedded programs, such as home appliances, electronic notes, portable multimedia players (PMPs), mobile communication terminals, tablet personal computers (PCs), video/audio devices, desktop/laptop computers, vehicle navigation systems, and so forth. For example, these electronic devices may output stored information in the form of sound or images. With the increasing integration of electronic devices and the common use of ultra-high-speed and large-volume wireless communication, various functions have recently come to be provided in a single electronic device, such as a mobile communication terminal. For example, various functions such as an entertainment function such as gaming, a multimedia function such as music/video playback, a communication and security function for mobile banking, and a function such as a schedule management or electronic wallet, as well as a communication function have been integrated into a single electronic device. Such an electronic device becomes increasingly more compact so that the user can conveniently carry it.

DETAILED DESCRIPTION OF THE DISCLOSURE

Technical Problem

In an electronic device, a camera module needs to be designed to restrict malfunction due to static electricity generated from the outside. The camera module may include a camera assembly, and a camera deco for covering the camera assembly. As a general electronic device has been designed such that a contact member (e.g., gasket sponge) is used as a surface mount device (SMD) on a printed circuit board positioned around the camera deco of the camera module, and the contact member directly contacts the camera deco, it was possible to prevent malfunction due to static electricity generated from the outside.

However, the structure of the contact member described above imposes limits on securing a mounting space in the electronic device, as the contact member has to be disposed on an area of the printed circuit board that overlaps (or faces) the camera deco. The above structure of the contact member may be difficult to maintain an appropriate contact point depending on characteristics such as a type and property of the contact member located in a gap between the camera deco and the printed circuit board.

According to an embodiment of the disclosure, it is possible to implement a contact structure between a camera deco and a surrounding metal structure by using a fixing member (e.g., a fastening structure) for fixing a camera assembly and/or a printed circuit board to an electronic device. Accordingly, it is possible to provide an improved electrostatic discharge (ESD) by securing a mounting space in the electronic device and having a fixed contact structure.

Technical Solution

An electronic device according to various embodiments of the disclosure may include a housing including a rear plate including an opening and a support bracket at least partially disposed along an edge of the rear plate; a camera deco disposed in the opening to be exposed to the outside, the camera deco covering a camera assembly and connected to the rear plate; a printed circuit board disposed in the housing; a rear structure supporting the camera assembly and the printed circuit board; a fixing member coupled to the rear structure and fixing the camera assembly and/or the printed circuit board to the support bracket; and a conductive member at least partially disposed between the camera deco and the fixing member to electrically connect the camera deco and the fixing member.

An electronic device according to various embodiments of the disclosure may include a housing including a rear plate including an opening and a camera deco disposed in the opening to be exposed to the outside and connected to the rear plate; a support bracket disposed in the housing; a printed circuit board disposed on an area of the support bracket; a camera assembly covered by the camera deco and configured to capture an external object through at least one opening formed in the camera deco; a fixing member for fixing the camera assembly and/or the printed circuit board to the support bracket; and a conductive member which is at least partially disposed between the camera deco and the fixing member to electrically connect the camera deco and the fixing member.

Advantageous Effects

According to various embodiments of the disclosure, a fixing member (e.g., a fastening structure) present for fixing a camera assembly and a printed circuit board may be utilized as a contact structure of a camera module. Accordingly, the fixing member may form a discharge path between a camera deco and a printed circuit board for improving electrostatic discharge (ESD).

According to various embodiments of the disclosure, the contact structure of the camera module may be implemented by a contact point between a conductive member positioned on a camera deco and a fixing member positioned on a support bracket. Since the conductive member does not require a separate mounting space to be disposed on the printed circuit board, a degree of freedom in design of the electronic device may be secured.

According to various embodiments of the disclosure, the contact structure of the camera module does not form separate thickness in the electronic device as the conductive member for improving the ESD is mounted inside the camera deco, and thus it is possible to save material costs according to improvement (e.g., reduction) in material and size.

The effects obtainable from the disclosure are not limited to the effects as described above, and other effects not described above will be clearly understood by a person skilled in the art, to which the disclosure belongs, from the following description.

MODE FOR CARRYING OUT THE INVENTION

Figure 1:
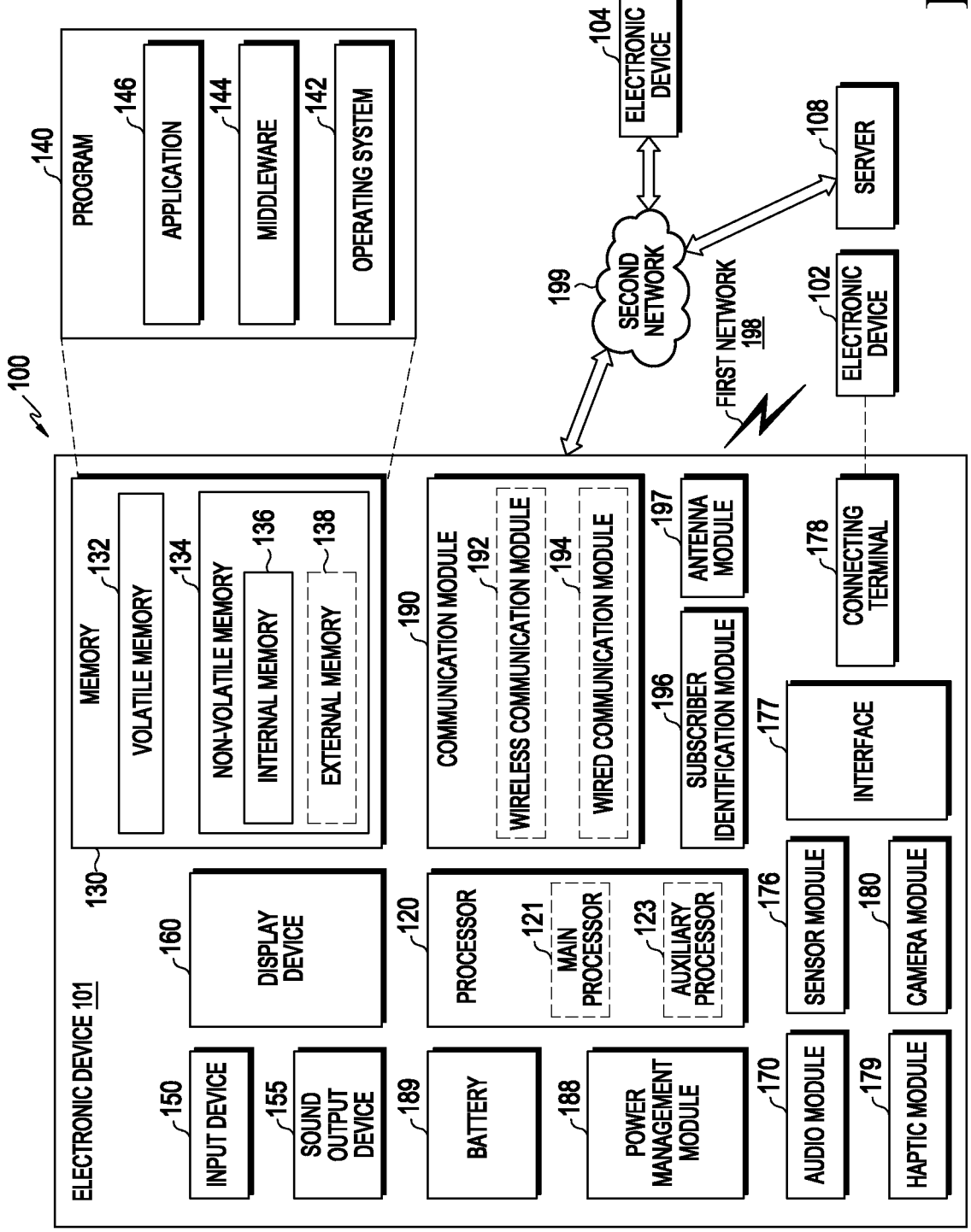
FIG. 1 is a block diagram illustrating an electronic device in a network environment according to various embodiments.

FIG. 1 is a block diagram illustrating an electronic device in a network environment according to various embodiments of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display device 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, a keyboard, keys (e.g., buttons), or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include one antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

An electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments of the disclosure may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
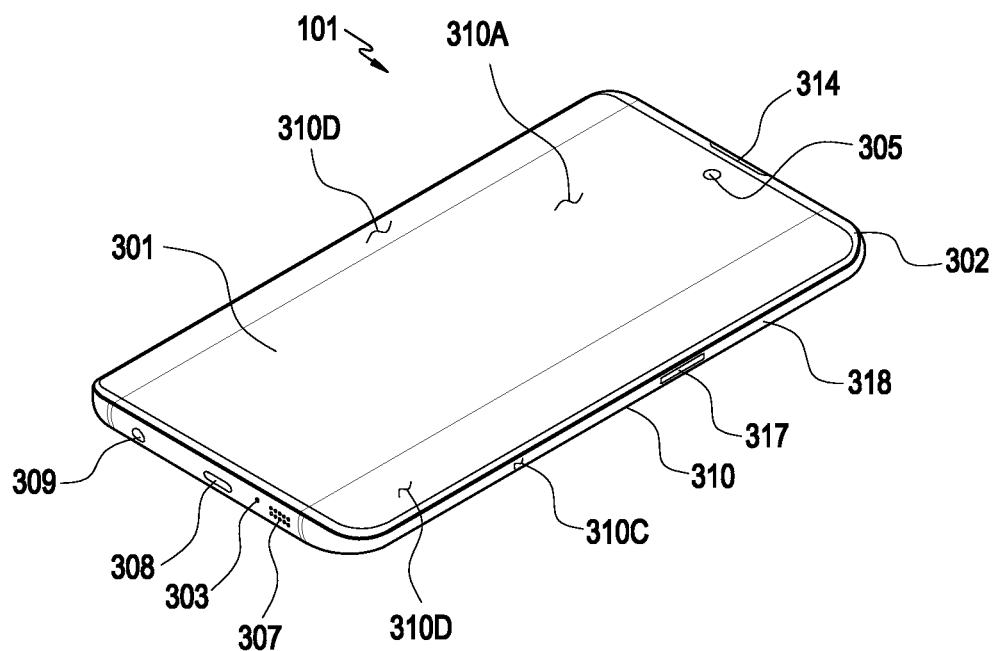
FIG. 2 is a front perspective view illustrating an electronic device according to various embodiments of the disclosure.
Figure 3:
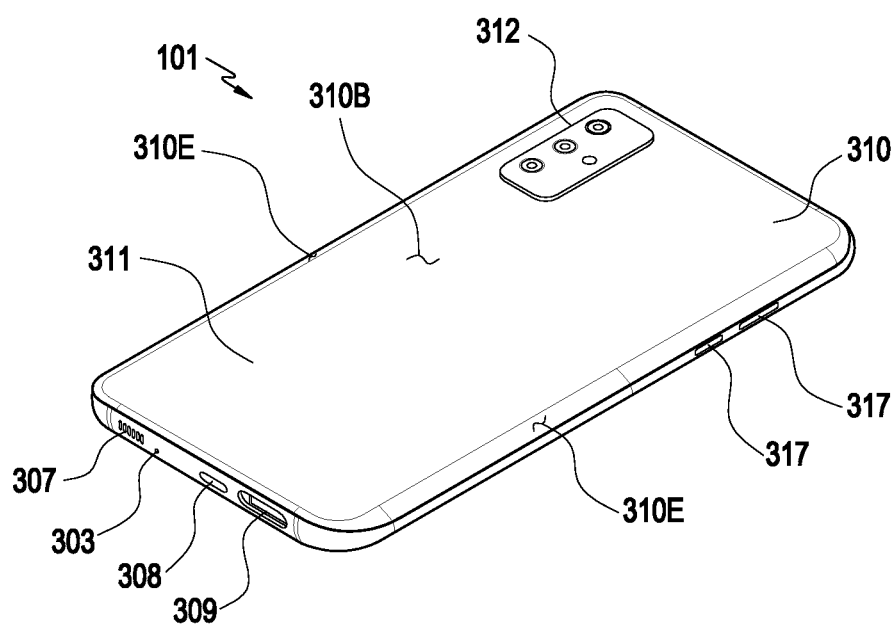
FIG. 3 is a rear perspective view illustrating an electronic device according to various embodiments of the disclosure.

FIG. 2 is a front perspective view illustrating an electronic device according to various embodiments of the disclosure. FIG. 3 is a rear perspective view illustrating an electronic device according to various embodiments of the disclosure.

Referring to FIGS. 2 and 3, the electronic device 101 according to an embodiment may include a housing 310 including a front surface 310A, a rear surface 310B, and side surface 310C surrounding a space defined between the front surface 310A and the rear surface 310B. In another embodiment (not shown), the housing 310 may refer to a structure that forms some of the front surface 310A of FIG. 2, the rear surface 310B and the side surface 310C of FIG. 3. According to an embodiment, at least a portion of the front surface 310A may be formed by a substantially transparent front plate 302 (e.g., a glass plate or a polymer plate including various coating layers). The rear surface 310B may be formed by a rear plate 311. The rear plate 311 may be formed of, for example, glass, ceramic, a polymer, or a metal (e.g., aluminum, stainless steel (STS), or magnesium), or a combination of two or more of these materials. The side surface 310C may be formed by a side bezel structure (or a side member) 318 coupled to the front plate 302 and the rear plate 311 and including a metal and/or a polymer. In some embodiments, the rear plate 311 and the side bezel structure 318 may be integrally formed, and include the same material (e.g., a metal material or ceramic such as glass, and aluminum).

In the illustrated embodiment, the front plate 302 may include two first edge areas 310D, which seamlessly and with a bend extend from the front surface 310A towards the rear plate 311, on both the long edges of the front plate 302. In the illustrated embodiment (see FIG. 3), the rear plate 311 may include two second edge areas 310E, which seamlessly and with a bend extend from the rear surface 310B towards the front plate 302, on both the long edges thereof. According to some embodiments, the front plate 302 (or the rear plate 311) may include only one of the first edge areas 310 (or the second edge areas 310E). In another embodiment, some of the first edge areas 310D or the second edge areas 310E may not be included. In the above embodiments, when viewed from a side of the electronic device 101, the side bezel structure 318 may have a first thickness (or width) for a side that does not include the first edge areas 310D or the second edge areas 310E, and may have a second thickness, which is thinner than the first thickness, for a side that includes the first edge areas 310D or the second edge areas 310E.

According to an embodiment, the electronic device 101 may include at least one or more of displays 330, and 301, audio modules 303, 307, and 314 (e.g., the audio module 170 of FIG. 1), a sensor module (e.g., the sensor module 176 of FIG. 1), camera modules 305, 312, and 313 (e.g., the camera module 180 of FIG. 1), a key input device 317 (e.g., the input device 150 of FIG. 1), and connector holes 308 and 309 (e.g., the connecting terminal 178 of FIG. 1). In some embodiments, at least one of the components (e.g., the connector hole 309) may be omitted from the electronic device 101, or the electronic device 101 may additionally include other components.

According to an embodiment, the displays 330 and 301 may be visually exposed, for example, through a large portion of the front plate 302. In some embodiments, at least a portion of the displays 330 and 301 may be exposed through the front plate 302 forming the front surface 310A and the first edge areas 310D. In some embodiments, the edges of the displays 330 and 301 may be formed to be substantially the same as the contour shape of the front plate 302 adjacent thereto. In another embodiment (not shown), the interval between the outer edge of the displays 330 and 301 and the outer edge of the front plate 302 may be substantially constant in order to enlarge the exposed area of the displays 330 and 301.

According to an embodiment, the surface (or the front plate 302) of the housing 310 may include a screen display area formed as the displays 330, and 301 is visually exposed. For example, the screen display area may include the front surface 310A and the first edge areas 310D.

In another embodiment (not shown), the screen display area (e.g., the front surface 310A, and the first edge area 310D) of the displays 330, and 301 may form a recess or an opening in a portion thereof, and may include at least one or more of the audio module 314, the sensor module (not shown), the light-emitting element (not shown), and the camera module 305, which is aligned with the recess or the opening. In another embodiment (not shown), at least one or more of the audio module 314, the sensor module (not shown), the camera module 305, the fingerprint sensor (not shown), and the light-emitting element (not shown) may be included on the rear surface of the screen display area of the displays 330, and 301. In another embodiment (not shown), the displays 330, and 301 may be coupled to or disposed adjacent to a touch-sensing circuit, a pressure sensor capable of measuring the intensity of the touch (pressure), and/or a digitizer detecting a magnetic field type stylus pen. In some embodiments, at least part of the key input device 317 may be disposed in the first edge areas 310D and/or the second edge areas 310E.

According to an embodiment, the audio modules 303, 307, and 314 may include, for example, a microphone hole 303 and speaker holes 307 and 314. The microphone hole 303 may include a microphone disposed therein to acquire external sound, and in some embodiments, a plurality of microphones may be disposed therein to be able to detect the direction of a sound. The speaker holes 307 and 314 may include an external speaker hole 307 and a phone call receiver hole 314. In some embodiments, the speaker holes 307 and 314 and the microphone hole 303 are implemented as a single hole, or a speaker may be included without the speaker holes 307 and 314 (e.g., a piezo speaker). The audio modules 303, 307, and 314 are not limited to the above-described structure, and may be variously changed in design depending on the structure of the electronic device 101, for example, by mounting only some of the audio modules or by adding new audio modules.

According to an embodiment, the sensor modules (not shown) may generate an electrical signal or a data value corresponding to, for example, an internal operating state or external environmental state of the electronic device 101. The sensor modules (not shown) may include, for example, a first sensor module (e.g., a proximity sensor) and/or a second sensor module (e.g., a fingerprint sensor) disposed on the front surface 310A of the housing 310, and/or a third sensor module (e.g., an HRM sensor) and/or a fourth sensor module (e.g., a fingerprint sensor) disposed on the rear surface 310B of the housing 310. In some embodiments (not shown), the fingerprint sensor may be disposed not only on the front surface 310A of the housing 310 (e.g., the displays 330 and 301), but also on the rear surface 310B. The electronic device 101 may further include at least one of sensor modules, which are not shown, such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, and an illuminance sensor. The sensor modules are not limited to the above-described structure, and may be variously changed in design depending on the structure of the electronic device 101, for example, by mounting some of the sensor modules or by adding new sensor modules.

According to an embodiment, the camera modules 305, 312, and 313 may include, for example, a front camera module 305 disposed on the front surface 310A of the electronic device 101, and a rear camera module 312 and/or a flash 313 disposed on the rear surface 310B. The camera modules 305 and 312 may include one or more lenses, an image sensor, and/or an image signal processor. The flash 313 may include, for example, a light-emitting diode or a xenon lamp. In some embodiments, two or more lenses (e.g., an infrared camera lens, a wide-angle lens, and a telephoto lens) and image sensors may be disposed on one surface of the electronic device 101. The camera modules 305, 312, and 313 are not limited to the above-described structure, and may be variously changed in design depending on the structure of the electronic device 101, for example, by mounting some of the camera modules or by adding new camera modules.

According to an embodiment, the electronic device 101 may include a plurality of camera modules (e.g., a dual camera or a triple camera) having different properties (e.g., angles of view) or functions, respectively. For example, a plurality of camera modules 305 and 312 including lenses having different angles of view may be configured, and the electronic device 101 may control the camera modules 305 and 312 to change the angles of view thereof executed therein based on a user's selection. For example, at least one of the plurality of camera modules 305 and 312 may be a wide-angle camera, and at least another one of the camera modules may be a telephoto camera. Similarly, at least one of the plurality of camera modules 305 and 312 may be a front camera, and at least another one of the camera modules may be a rear camera. In addition, the plurality of camera modules 305 and 312 may include at least one of a wide-angle camera, a telephoto camera, and an infrared (IR) camera (e.g., a time-of-flight (TOF) camera, or a structured light camera). According to an embodiment, the IR camera may be operated as at least a portion of a sensor module. For example, the TOF camera may be operated as at least a portion of a sensor module (not shown) for detecting a distance to a subject.

According to an embodiment, the key input device 317 may be disposed on the side surface 310C of the housing 310. In another embodiment, the electronic device 101 may not include some or all of the above-mentioned key input device 317, and a key input device 317, which is not included therein, may be implemented in another form such as a soft key on the display 301. In some embodiments, the key input device may include a sensor module 316 disposed on the second surface (e.g., rear surface 310B) of the housing 310.

According to an embodiment, the light-emitting element (not shown) may be disposed on, for example, the front surface 310A of the housing 310. The light-emitting element (not shown) may provide, for example, state information of the electronic device 101 in the form of light. In another embodiment, the light-emitting element (not shown) may provide a light source that interacts with, for example, the operation of the front camera module 305. The light-emitting element (not shown) may include, for example, an LED, an IR LED, and a xenon lamp.

According to an embodiment, the connector holes 308 and 309 may include, for example, a first connector hole 309 capable of accommodating a connector (e.g., a USB connector) for transmitting/receiving power and/or data to/from an external electronic device, and/or a second connector hole 308 (e.g., an earphone jack) capable of accommodating a connector for transmitting/receiving an audio signal to/from an external electronic device.

According to an embodiment, some camera module 305 of the camera modules 305 and 312 and/or some sensor modules (not shown) of the sensor modules may be disposed to be exposed to the outside through at least a portion of the displays 330 and 301. For example, the camera modules 305 may include a punch hole camera disposed inside a hole or recess formed on the rear surface of the displays 330 and 301. According to an embodiment, the camera module 312 may be disposed inside the housing 310 such that the lens is exposed to the second surface (e.g., rear surface 310B) of the electronic device 101. For example, the camera modules 312 may be disposed on a printed circuit board (e.g., the printed circuit board 340 of FIG. 4).

According to an embodiment, the camera module 305 and/or the sensor module may be disposed from the internal space of the electronic device 101 to the front plate 302 of the displays 330, and 301 to come into contact with the external environment through a transparent area. In addition, some sensor modules 304 may be disposed in the internal space in the electronic device to implement the functions thereof without being visually exposed through the front plate 302.

Figure 4:
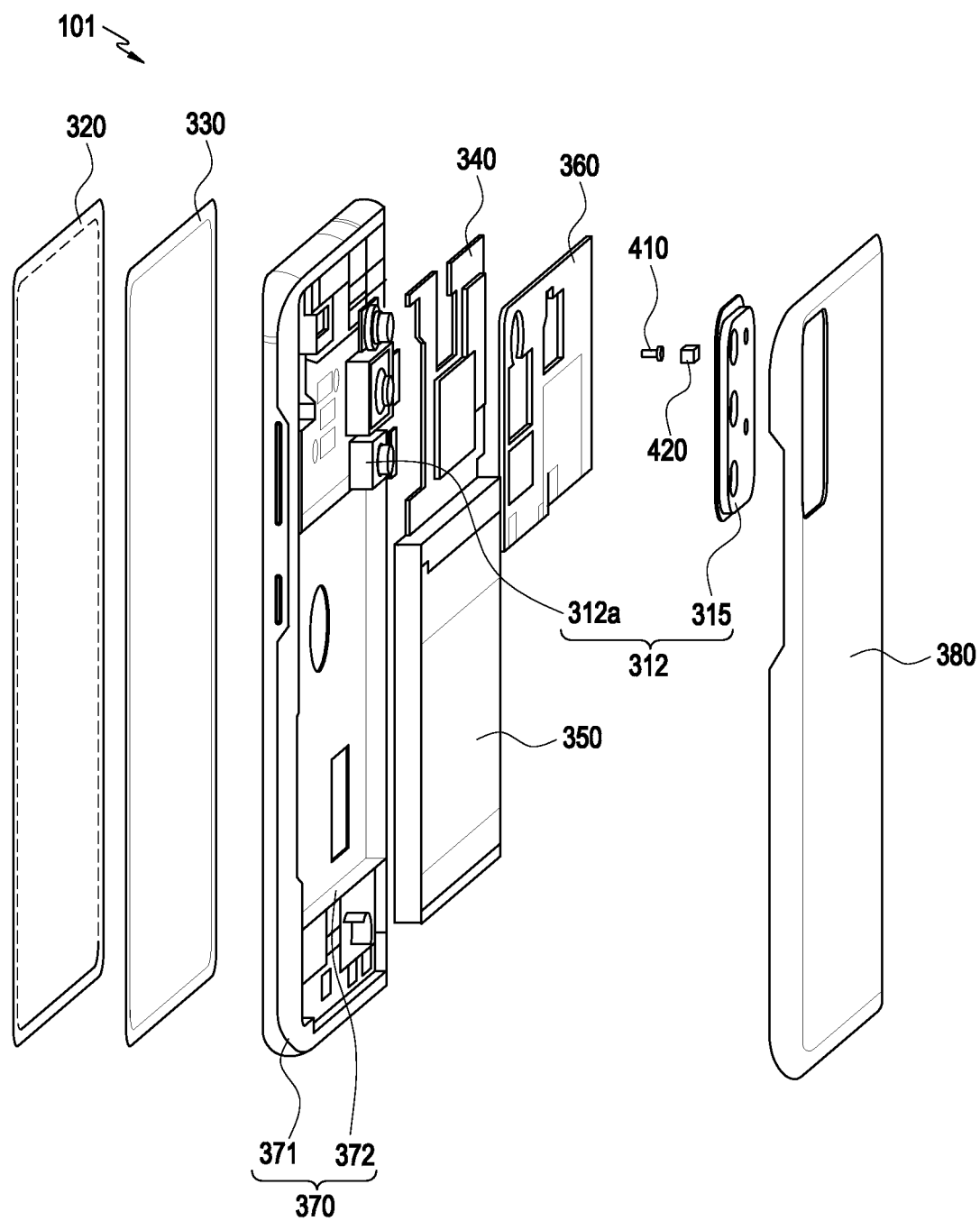
FIG. 4 is an exploded perspective view illustrating an electronic device according to various embodiments of the disclosure.

FIG. 4 is an exploded perspective view illustrating an electronic device according to various embodiments.

Referring to FIG. 4, the electronic device 101 (e.g., the electronic device 101 of FIGS. 1 to 3) according to various embodiments may include a support bracket 370, a front plate 320 (e.g., the front plate 302 of FIG. 2), displays 330 (e.g., the display 301 of FIG. 2), a printed circuit board 340 (e.g., a PCB, flexible PCB (FPCB), or a rigid flexible PCB (RFPCB)), a battery 350 (e.g., the battery 189 of FIG. 1), a second support member 360 (e.g., the rear structure), an antenna (not shown) (e.g., the antenna module 197 of FIG. 1), and a rear plate 380 (e.g., the rear plate 311 of FIG. 2). The electronic device 101 may further include a camera module 312 that includes a camera assembly 312a and a camera deco 315, a fixing member 410, and a conductive member 420. The support bracket 370 of the electronic device 101 according to an embodiment may include a side bezel structure 371 (e.g., the side bezel structure 318 of FIG. 2) and a first support member 372.

In some embodiments, in the electronic device 101, at least one of the components (e.g., the first support member 372 or the second support member 360) may be omitted, or other components may be additionally included. At least one of the components of the electronic device 101 may be the same as or similar to at least one of the components of the electronic device 101 in FIG. 2 or FIG. 3, and a redundant description thereof will be omitted below.

According to various embodiments, the first support member 372 may be disposed in the electronic device 101 to be connected to the side bezel structure 371, or may be integrated with the side bezel structure 371. The first support member 372 may be formed of, for example, a metal material and/or a non-metal material (e.g., a polymer). The display 330 may be coupled to one surface of the first support member 332, and the printed circuit board 340 may be coupled to the other surface of the first support member 332.

According to various embodiments, on the printed circuit board 340, a processor, a memory, and/or an interface may be mounted. The processor may include various processing circuitry including, for example, one or more of, for example, a central processing unit, an application processor, a graphics processor, an image signal processor, a sensor hub processor, or a communication processor. According to various embodiments, the printed circuit board 340 may include a flexible printed circuit board type radio frequency cable (FRC). For example, the printed circuit board 340 may be disposed on at least a portion of the first support member 372, and may be electrically connected to an antenna module (e.g., the antenna module 197 of FIG. 1) and a communication module (e.g., the communication module 190 of FIG. 1).

According to an embodiment, the memory may include, for example, a volatile memory or a nonvolatile memory.

According to an embodiment, the interface may include, for example, a high-definition multimedia interface (HDMI), a universal serial bus (USB) interface, an SD card interface, and/or an audio interface. The interface may electrically or physically connect, for example, the electronic device 101 to an external electronic device, and may include a USB connector, an SD card/an MMC connector, or an audio connector.

According to various embodiments, the battery 350, which is a device for supplying power to at least one component of the electronic device 101, may include, for example, a non-rechargeable primary battery, a rechargeable secondary battery, or a fuel cell. At least a portion of the battery 350 may be disposed on substantially the same plane as, for example, the printed circuit board 340. The battery 350 may be integrally disposed inside the electronic device 101, or may be detachably disposed on the electronic device 101.

According to various embodiments, the second support member 360 (e.g., the rear structure) may be disposed between the printed circuit board 340 and the antenna. For example, the second support member 360 may include one surface to which at least one of the printed circuit board 340 or the battery 350 is coupled, and the other surface to which the antenna is coupled.

According to various embodiments, the antenna (not shown) may be disposed between the rear plate 380 and the display 350. The antenna may include, for example, a near field communication (NFC) antenna, a wireless charging antenna, and/or a magnetic secure transmission (MST) antenna. The antenna may perform short-range communication with, for example, an external electronic device, or may wirelessly transmit/receive power that is required for charging to/from the external device. In another embodiment, an antenna structure may be included with a part of the side bezel structure 371 and/or the first support member 372, or a combination thereof.

According to various embodiments, the rear plate 380 may form at least a portion of the rear surface (e.g., the second surface 310B of FIG. 3) of the electronic device 101.

According to various embodiments, the fixing member 410 may be coupled to the second support member 360, and the conductive member 420 may be positioned between the fixing member 410 and the camera deco. Hereinafter, the contact structure of the camera module including the fixing member 410 and the conductive member 420 will be described in detail.

Figure 5:
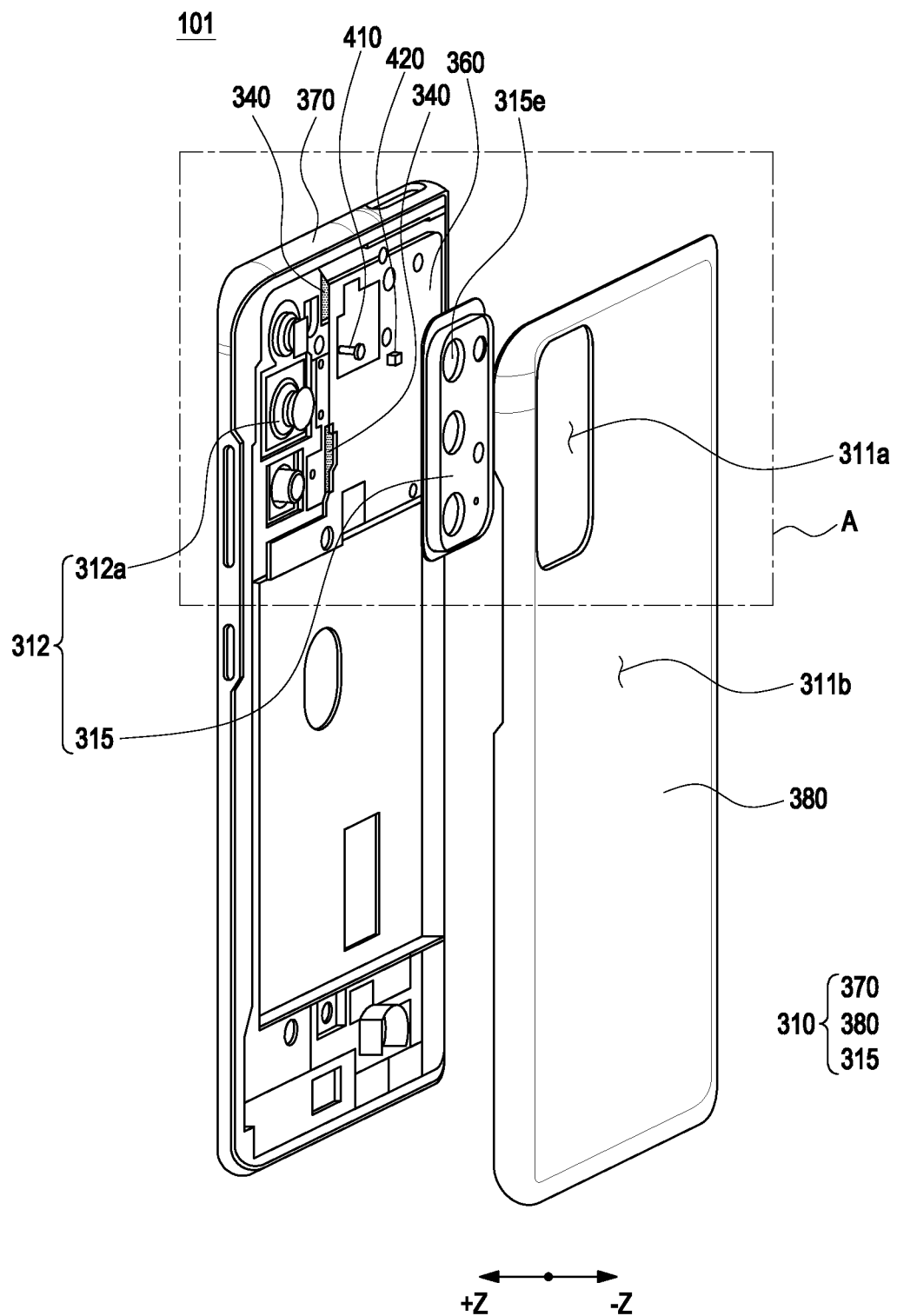
FIG. 5 is an exploded perspective view illustrating a support bracket, a rear plate, and a camera deco connected to the rear plate in an electronic device, according to one of various embodiments of the disclosure.

FIG. 5 is an exploded perspective view illustrating a support bracket, a rear plate, and a camera deco connected to the rear plate in an electronic device, according to one of various embodiments of the disclosure.

Figure 6:
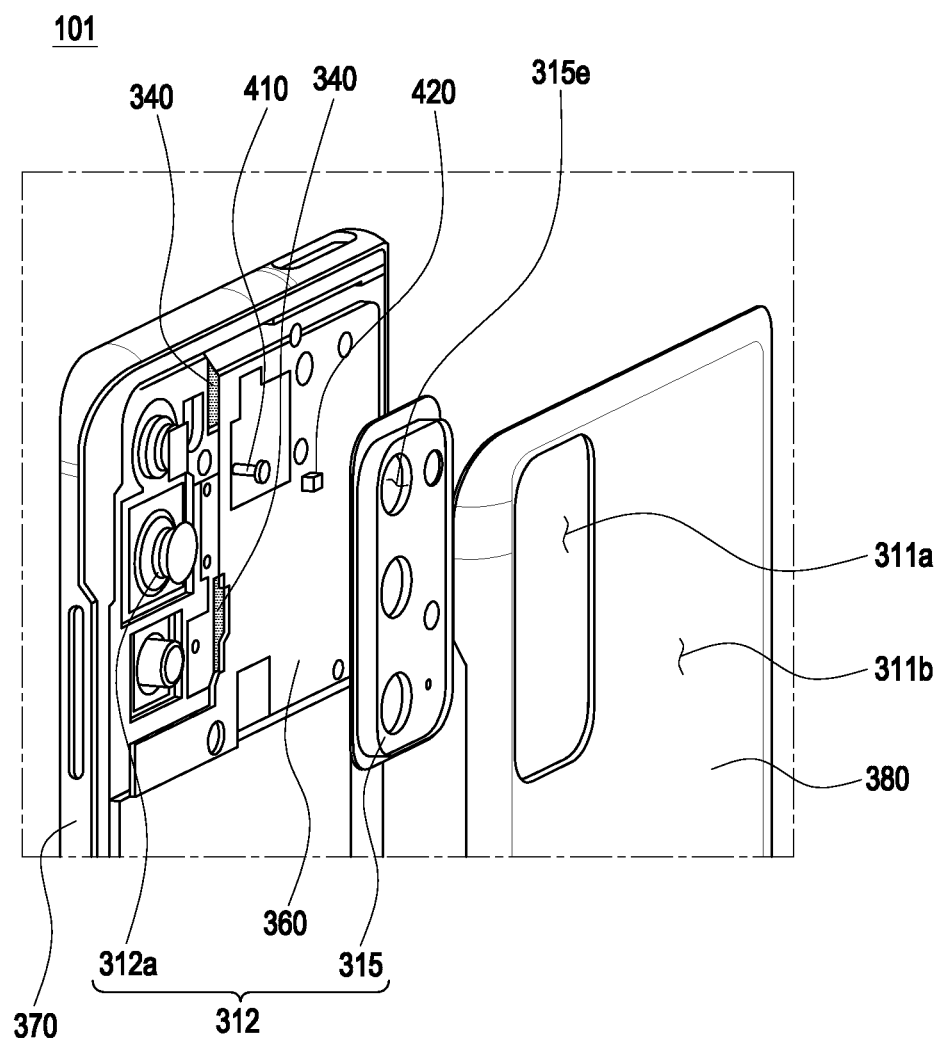
FIG. 6 is an exploded perspective view enlarging area A of FIG. 5.

FIG. 6 is an exploded perspective view enlarging area A of FIG. 5.

According to various embodiments, the electronic device (e.g., the electronic device 101 of FIGS. 1 to 4) may include a housing (e.g., the housing 310 of FIGS. 2 and 3) and a rear structure 360 disposed in the housing 310 (e.g., the second support member 360 of FIG. 4), a camera module 312, and a printed circuit board 340.

According to an embodiment, a camera module (e.g., the camera module 312 of FIG. 3) includes a camera assembly 312a including one or more lenses, an image sensor, and/or an image signal processor, and a camera deco 315 covering the camera assembly 312a. According to another embodiment, the housing 310 may include the rear plate 380 covering the rear surface of the electronic device 101, and the camera deco 315 covering the camera assembly (e.g., the camera module 312 of FIG. 3), and at least partially forming the rear surface of the electronic device 101. The housing 310 may further include the support bracket 370 providing a mounting space for the side components and internal components of the electronic device 101.

The configurations of the housing 310, the camera module 312, the rear structure 360, and the printed circuit board 340 of FIGS. 5 and 6 may be partially or entirely the same as those of the housing 310, and the camera module 312 of FIGS. 2 and 3, the rear structure 360, and the printed circuit board 340 of FIG. 4.

According to various embodiments, the rear surface (e.g., the surface facing the +Z axis) of the housing 310 may be formed by the first surface 311b of the rear plate 380 and the camera deco 315 of the camera module 312. According to an embodiment, the rear plate 380 may include the first surface 311b and an opening 311a formed in an area (e.g., an edge adjacent area) of the first surface 311b. The camera deco 315 has a shape corresponding to the shape of the opening 311a such that the edge area thereof may be fitted in the opening 311a, and may be at least partially exposed to the outside of the opening 311a (e.g., in the +Z-axis direction). According to an embodiment, the camera deco 315 may be designed to have a different thickness compared to the adjacent opening 311a. As another example, when the rear plate 380 is formed of a metal material, the camera deco 315 may be electrically connected to the rear plate 380 via a direct contact.

According to various embodiments, the camera deco 315 is a separate configuration isolated from the rear plate 380 and may include a metal material (e.g., aluminum). The camera deco 315 may include at least one opening 315e corresponding to the number of lens assemblies of the camera module 312 and reduce an external impact transmitted to the camera module 312, thereby protecting the camera module 312.

According to various embodiments, the printed circuit board 340 may be disposed in one area of the support bracket 370 of the housing 310 and a battery (e.g., the battery 350 of FIG. 4) may be disposed in the other area thereof. For example, the camera module 312 may be disposed on one side of the printed circuit board 340, the battery may be disposed on the other side thereof, and the camera module 312 and/or the battery may be electrically connected to the printed circuit board 340.

According to various embodiments, the rear structure 360 may be positioned between the rear plate 380 and the printed circuit board 340. One area of the rear structure 360 may cover the printed circuit board 340, and the other area thereof may cover a part of the camera assembly 312a. For example, the rear structure 360 may substantially cover most of the surfaces facing the second direction (−Z-axis direction) of the printed circuit board 340. Accordingly, the rear structure 360 may support the camera assembly 312a and/or the printed circuit board 340 so as not to move due to an external impact.

According to an embodiment, the rear structure 360 may be provided as an injection molding (e.g., a non-conductive material), and forms a conductive pattern (not shown) to be used as an antenna radiator on one area thereof (e.g., a surface facing the second direction (−Z-axis direction)). The conductive pattern may be a laser direct structuring (LDS) pattern, and may be formed of a conductive material including a metal material such as copper or nickel. For example, the laser direct structuring (LDS) pattern may be formed through a plating and coating process after selectively processing the pattern using a laser on an injection product (e.g., a material including a thermoplastic resin). Through laser processing, it is possible to facilitate the plating of metal materials on the rough resin surface in the micro scale.

According to various embodiments, the electronic device 101 may include a fixing member 410 and a conductive member 420 which are disposed adjacent to the camera module 312. The fixing member 410 and/or the conductive member 420 may provide a discharge path for improving electrostatic discharge (ESD) of the camera module 312.

According to various embodiments, the fixing member 410 may be coupled to the rear structure 360 to fix the camera assembly 312a and/or the printed circuit board 340 to the support bracket 370. For example, the fixing member 410 includes a fastening structure such as a screw, and one surface of the fixing member 410 facing the second direction (−Z-axis direction) is disposed to face the camera deco 315 and/or the conductive member 420, and the other part (e.g., a part including a threaded screw) of the fixing member 410 may be inserted and fixed to the rear structure 360 and the support bracket 370.

According to various embodiments, the conductive member 420 may be disposed between the fixing member 410 and the camera deco 315 to electrically connect the fixing member 410 and the camera deco 315. For example, the conductive member 420 may be made of a material including elasticity and conductivity. The specified compression and tensile rates provided by the fixing member 410 may prevent a lifting phenomenon between the camera deco 315 and the rear structure 360. The conductive member 420 may form a part of a discharge path for improving electrostatic discharge (ESD) by providing a structure electrically connected to the fixing member 410 and/or the camera deco 315.

Figure 7:
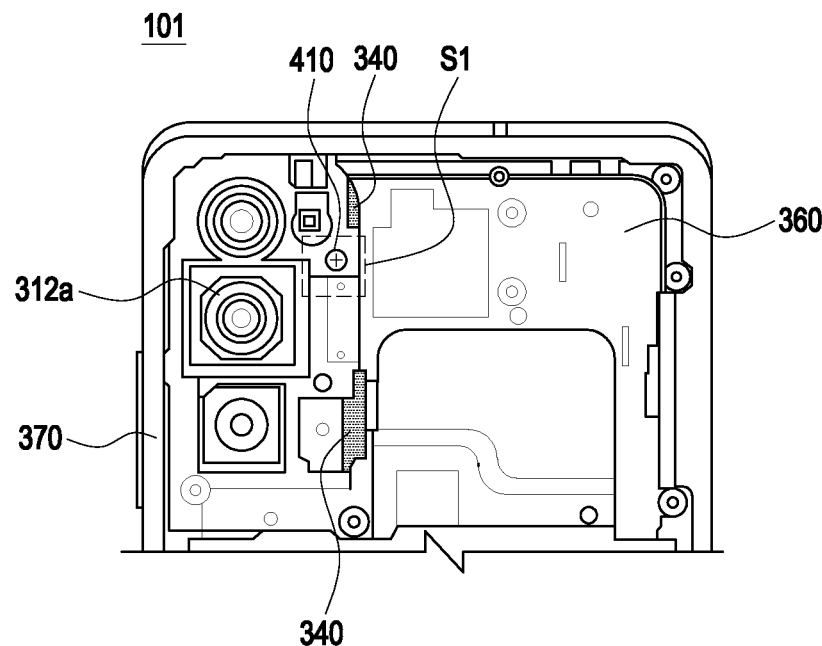
FIG. 7 is a view illustrating a support bracket and a rear structure coupled on the support bracket in a state in which the rear plate of the electronic device is removed, according to one of various embodiments of the disclosure.

FIG. 7 is a view illustrating a support bracket and a rear structure coupled on the support bracket in a state in which the rear plate of the electronic device is removed, according to one of various embodiments of the disclosure.

Figure 8A:
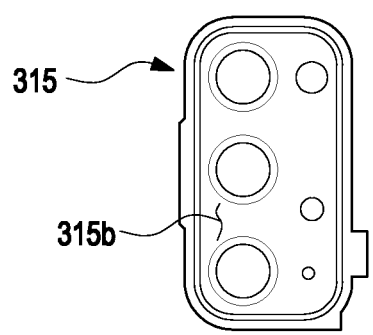
FIG. 8A is a view illustrating a side of the camera deco viewed in one direction, according to one of various embodiments of the disclosure.

FIG. 8A is a view illustrating a side of the camera deco viewed in one direction, according to one of various embodiments of the disclosure.

Figure 8B:
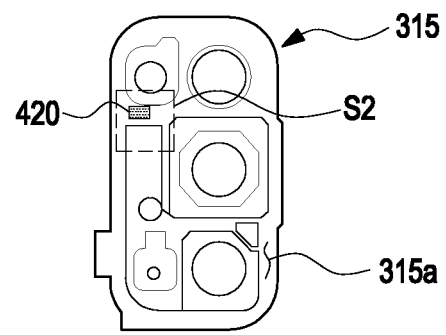
FIG. 8B is a view illustrating another side of a camera deco viewed in another direction, according to one of various embodiments of the disclosure.

FIG. 8B is a view illustrating another side of a camera deco viewed in another direction, according to one of various embodiments of the disclosure.

According to various embodiments, the electronic device (e.g., the electronic device 101 of FIGS. 1 to 4) may include the support bracket 370, the rear structure 360, the camera module (e.g., the camera module 312 of FIG. 3), the printed circuit board 340, the fixing member 410, and the conductive member 420. According to an embodiment, the camera module (e.g., the camera module 312 of FIG. 3) may include a camera assembly 312a including one or more lenses, an image sensor, and/or an image signal processor, and the camera deco 315 covering the camera assembly 312a.

The configurations of the support bracket 370, the rear structure 360, the printed circuit board 340, the fixing member 410, and the conductive member 420 of FIGS. 7 to 8B are partially or entirely the same as those of the support bracket 370, the rear structure 360, the printed circuit board 340, the fixing member 410, and the conductive member 420 of FIGS. 5 and 6.

According to various embodiments, the fixing member 410 may be positioned in a first area S1 of the rear structure 360. For example, the rear structure 360 may provide a hole including a threaded screw in the first area S1 thereof, and the fixing member 410 may be inserted (e.g., fastened) into the hole. The fixing member 410 may fix the rear structure 360 to a portion of the rear structure 360 and/or the camera assembly 312a together with other surrounding fixing members.

According to various embodiments, the camera deco 315 may include a first surface 315a facing the inside of the electronic device 101 and a second surface 315b formed to be exposed to the outside of the electronic device 101. According to an embodiment, the conductive member 420 may be positioned in a second area S2 of the first surface 315a of the camera deco 315. For example, the second area S2 of the camera deco 315 is provided to form a recess having a size corresponding to that of the conductive member 420, and the conductive member 420 inserted into the recess may stably maintain contact with the fixing member 410. As another example, an adhesive member (e.g., a tape or a bond) may be disposed on one surface of the conductive member 420, or a bonding force between the conductive member 420 and the camera deco 315 may be strengthened.

According to various embodiments, when viewed from above the camera deco 315 (e.g., when viewed by projecting the camera deco 315), a portion of the first area S1 of the rear structure 360 may be overlapped with the second area S2 of the camera deco 315. According to another embodiment, when viewed from above the camera deco 315 (e.g., when viewed by projecting the camera deco 315), a portion of the second area S2 of the camera deco 315 may be disposed to be overlapped with the first area S1 of the rear structure 360. The conductive member 420 and the fixing member 410 may each include surfaces in contact with each other, and may electrically connect the camera deco 315 and the support bracket 370 to each other.

In the contact structure of the camera module according to the disclosure, the conductive member 420 may be provided as a contact structure for improving ESD, serving as a fastening structure for fixing the rear structure 360 to the electronic device 101. Accordingly, a contact structure requiring a separate space in one area of the printed circuit board 340 may be excluded, and thus it is possible to secure an additional mounting space of the electronic device 101 and to provide a degree of freedom in design.

Figure 9:
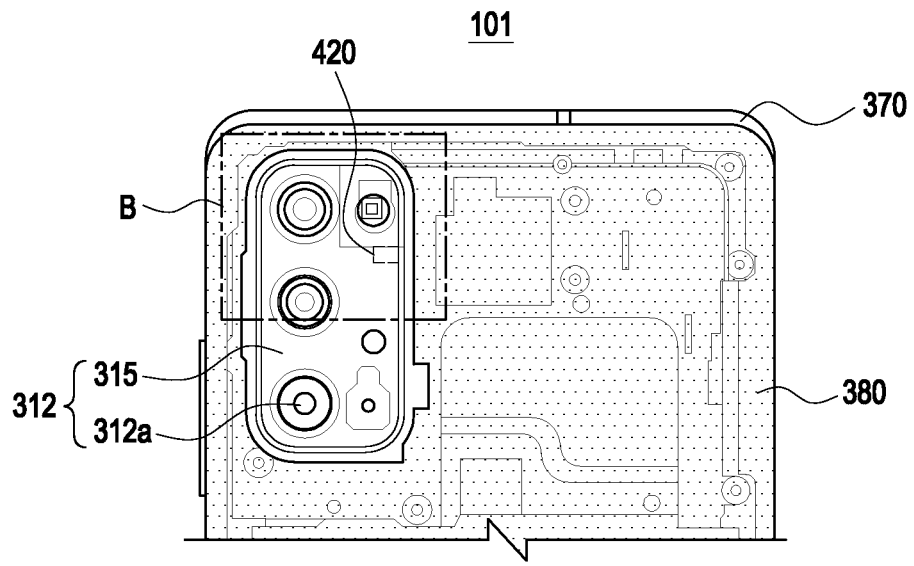
FIG. 9 is a view illustrating a support bracket and a rear structure coupled on the support bracket in an electronic device, viewed by projecting a rear plate, according to one of various embodiments of the disclosure.

FIG. 9 is a view illustrating a support bracket and a rear structure coupled on the support bracket in an electronic device, viewed by projecting a rear plate, according to one of various embodiments of the disclosure.

Figure 10:
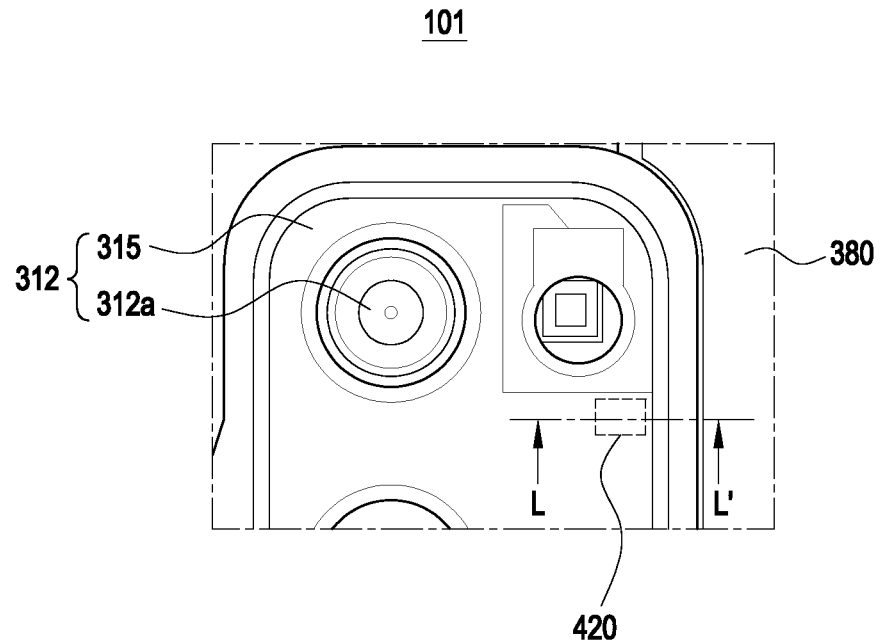
FIG. 10 is an enlarged projection view of area B of FIG. 9.

FIG. 10 is an enlarged projection view of area B of FIG. 9.

Figure 11:
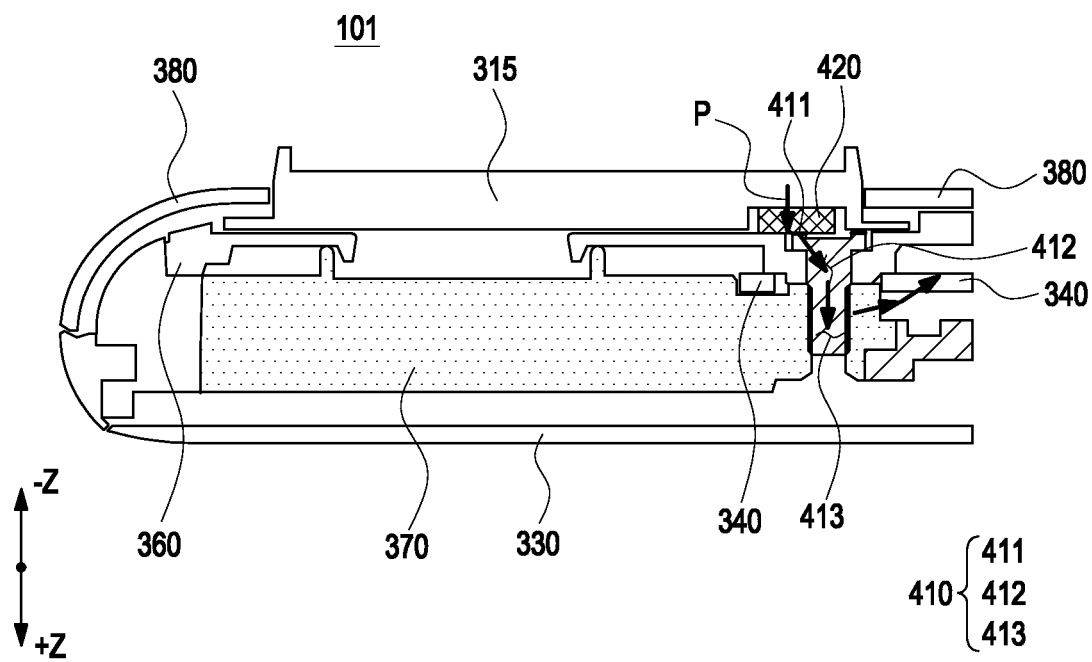
FIG. 11 is a cross-sectional view taken along line L-L' of FIG. 10.

FIG. 11 is a cross-sectional view taken along line L-L' of FIG. 11.

According to various embodiments, the electronic device (e.g., the electronic device 101 of FIGS. 1 to 4) may include the display 330, the rear plate 380, the support bracket 370, the rear structure 360, and the camera module (e.g., the camera module 312 of FIG. 3), the printed circuit board 340, the fixing member 410, and the conductive member 420. According to one embodiment, the camera module (e.g., the camera module 312 of FIG. 3) may include the camera assembly 312a including one or more lenses, an image sensor, and/or an image signal processor, and the camera deco 315 covering the camera assembly 312a.

The configurations of the display 330 and the rear plate 380 of FIGS. 9 to 11 may be partially or entirely the same as those of the display 330 and the rear plate 380 of FIG. 4. The configurations of the support bracket 370, the rear structure 360, the printed circuit board 340, the fixing member 410, and the conductive member 420 of FIGS. 9 to 11 may be partially or entirely the same as those of the support bracket 370, the rear structure 360, the printed circuit board 340, the fixing member 410, and the conductive member 420 of FIGS. 5 to 8B.

According to various embodiments, when viewed from the rear surface of the electronic device 101 (e.g., when viewed toward the rear plate 380), the conductive member 420 and the fixing member 410 may be disposed along the first direction (+Z-axis direction) with respect to the camera deco 315. The rear structure 360 and the support bracket 370 may be positioned along the edge of the fixing member 410, and the printed circuit board 340 may be positioned in an area adjacent to the support bracket 370.

According to various embodiments, the fixing member 410 may form a discharge path L between the camera deco 315 and the support bracket 370 in order to prevent the camera module 312 from being damaged due to static electricity. For example, the discharge path L may be formed to discharge static electricity generated in the electronic device 101 (or the camera module 312) along the camera deco 315, the conductive member 420, the fixing member 410, the support bracket 370 and the printed circuit board 340.

According to an embodiment, the conductive member 420 attached to an area of the camera deco 315 may be designed to be in direct contact with the fixing member 410 so that static electricity can be discharged.

According to an embodiment, the fixing member 410 may be disposed to be in contact with a plurality of components. Since the rear structure 360 for supporting the camera module 312 and/or the printed circuit board 340 is formed of an injection molding material, the fixing member 410 cannot directly provide a conductive path. Accordingly, the fixing member 410 passes through the rear structure 360 and is formed to be in direct contact with the support bracket 370 formed of a conductive member, thereby providing a path.

For example, the fixing member 410 may include a first portion 411 for electrically connecting to the camera deco 315 (or the conductive member 420), a second portion 412 for coupling with the rear structure 360, and a third portion 413 coupled to the support bracket 370 and provided for electrical connection. The first portion 411 may be one surface facing the second direction (−Z-axis direction) of the fixing member 410 to directly form a contact point with the conductive member 420. As the second portion 412, which is an extension portion for connecting the first portion 411 and the third portion 413, is formed to penetrate the rear structure 360 (e.g., a non-metal structure), it is possible to electrically connect the metal structures (e.g., the camera deco 315 and the support bracket 370) separated by the non-metal structure. The third portion 413 is disposed in contact with the support bracket 370 to extend the discharge path L formed along the first portion 411, the second portion 412, and the third portion 413 to the support bracket 370.

According to various embodiments, the printed circuit board 340 may be electrically connected to the support bracket 370. For example, the printed circuit board 340 may be disposed on one area of the support bracket 370 via a direct contact. In another example, as the printed circuit board 340 is disposed adjacent to and spaced apart from one area of the support bracket 370, electrical flow may be provided by means of coupling. As a result, it is possible that static electricity may be discharged through the ground of the printed circuit board 340.

In the contact structure of the camera module according to the disclosure, the conductive member 420 may be provided as a contact structure for improving the ESD, serving as a fastening structure for fixing the rear structure 360 to the electronic device 101. Accordingly, since a contact structure requiring a separate space in one area of the printed circuit board 340 may be excluded, it is possible to secure an additional mounting space of the electronic device 101 and provide a degree of freedom in design.

An electronic device (e.g., the electronic device of FIGS. 1 to 4) according to various embodiments of the disclosure may include a housing (e.g., 310 of FIG. 5) including a rear plate (e.g., 380 of FIG. 5) including an opening (e.g., 311*a* of FIG. 5) and a support bracket (e.g., 370 of FIG. 5) at least partially disposed along an edge of the rear plate; a camera deco (e.g., 315 of FIG. 5) disposed in the opening to be exposed to the outside, the camera deco covering a camera assembly (e.g., 312*a* of FIG. 5) and connected to the rear plate; a printed circuit board (e.g., 340 of FIG. 5) disposed in the housing; a rear structure (e.g., 360 of FIG. 5) supporting the camera assembly and the printed circuit board; a fixing member (e.g., 410 of FIG. 5) coupled to the rear structure and fixing the camera assembly and/or the printed circuit board to the support bracket; and a conductive member (e.g., 420 of FIG. 5) at least partially disposed between the camera deco and the fixing member to electrically connect the camera deco and the fixing member.

According to various embodiments, at least a portion of the fixing member and the conductive member may be disposed in contact with each other.

According to various embodiments, the fixing member may be disposed to extend to the inside of the support bracket through a portion of the rear structure.

According to various embodiments, the electronic device may be configured to form a discharge path from the camera assembly to the printed circuit board through the camera deco, the conductive member, the fixing member electrically connected to the conductive member, and the support bracket.

According to various embodiments, the fixing member may comprise a first portion (e.g., 411 of FIG. 11) disposed to form a contact point with the camera deco or the conductive member, a second portion (e.g., 412 of FIG. 11) for coupling with the rear structure, and a third portion (e.g., 413 of FIG. 11) coupled to the support bracket and provided for electrical connection between the support bracket and the camera deco.

According to various embodiments, the fixing member may be a fastening member including a threaded screw for coupling the support bracket and the rear structure.

According to various embodiments, the conductive member may be disposed in contact with the camera deco and is compressed by being pressed by the fixing member to thereby restrict the formation of a gap between the conductive member and the camera deco.

According to various embodiments, the inside of the camera deco may include a recess and at least a portion of the conductive member may be disposed in the recess.

According to various embodiments, the conductive member may be disposed adjacent to an edge of the camera deco and formed to protrude in a direction opposite to the rear plate.

According to various embodiments, the conductive member may include an elastic material.

According to various embodiments, the printed circuit board may be disposed adjacent to the support bracket.

According to various embodiments, at least a portion of the printed circuit board may be formed to surround at least a portion of the fixing member.

According to various embodiments, the printed circuit board may be spaced apart from the conductive member.

According to various embodiments, the support bracket comprises a first area and a second area partitioned from the first area, wherein the camera assembly and the printed circuit board may be disposed in the first area and the battery may be disposed in the second area.

According to various embodiments, the electronic device may further comprise a display (e.g., 330 of FIG. 4) disposed in the housing and disposed to face a direction opposite to the rear plate, and a battery (e.g., 350 of FIG. 4) disposed in an area partitioned from the printed circuit board.

An electronic device (e.g., the electronic device 101 of FIGS. 1 to 4) according to various embodiments of the disclosure may include a housing (e.g., 310 of FIG. 5) that includes a rear plate (e.g., 380 of FIG. 5) including an opening; and a camera deco (e.g., 315 of FIG. 5) disposed in the opening to be exposed to the outside and connected to the rear plate; a support member (e.g., the first support member 372 of FIG. 4) disposed in the housing; a printed circuit board (e.g., 340 of FIG. 5) disposed in one area of the support member; a camera assembly (e.g., 312*a* of FIG. 5) covered by the camera deco and configured to capture an external object through at least one opening formed in the camera deco; a fixing member (e.g., 410 of FIG. 5) configured to fix the camera assembly and/or the printed circuit board to the support bracket; and a conductive member at least partially disposed between the camera deco and the fixing member to electrically connect the camera deco and the fixing member.

According to various embodiments, the electronic device may further comprise a rear structure (e.g., 360 of FIG. 5) supporting the camera assembly and the printed circuit board, wherein the fixing member is coupled to the rear structure to fix the camera assembly and/or the printed circuit board to the support member.

According to various embodiments, at least a portion of the fixing member and the conductive member may be disposed to be in contact with each other.

According to various embodiments, the fixing member may be disposed to extend through a portion of the rear structure to the inside of the support bracket.

According to various embodiments, the electronic device may form a discharge path facing from the camera assembly to the printed circuit board through the camera deco, the conductive member, the fixing member electrically connected to the conductive member, and the support bracket.

It will be apparent to one of ordinary skill in the art that the contact structure of the camera module and the electronic device comprising the same according to the disclosure as described above are not limited to the above-described embodiments and those shown in the drawings, and various changes, modifications, or alterations may be made thereto without departing from the scope of the present invention.

The invention claimed is:
1. An electronic device, comprising:
a housing comprising a rear plate including an opening and a support bracket at least partially disposed along an edge of the rear plate;
a camera deco disposed in the opening to be exposed to an outside, the camera deco covering a camera assembly and connected to the rear plate;
a printed circuit board disposed in the housing;
a rear structure supporting the camera assembly and the printed circuit board;

a fixing member coupled to the rear structure and fixing the camera assembly and/or the printed circuit board to the support bracket; and a conductive member at least partially disposed between the camera deco and the fixing member to electrically connect the camera deco and the fixing member.

2. The electronic device of claim 1, wherein at least a portion of the fixing member and the conductive member are disposed to be in contact with each other.

3. The electronic device of claim 2, wherein the fixing member is disposed to extend to an inside of the support bracket through a portion of the rear structure.

4. The electronic device of claim 2, wherein the electronic device is configured to form a discharge path from the camera assembly to the printed circuit board through the camera deco, the conductive member, the fixing member electrically connected to the conductive member, and the support bracket.

5. The electronic device of claim 2, wherein the fixing member comprises:
a first portion disposed to form a contact point with the camera deco or the conductive member;
a second portion for coupling with the rear structure; and
a third portion coupled to the support bracket and provided for electrical connection with the support bracket and the camera deco.

6. The electronic device of claim 2, wherein the fixing member is a fastening member including a threaded screw for coupling the support bracket and the rear structure.

7. The electronic device of claim 2, wherein the conductive member is disposed to be in contact with the camera deco and is compressed by being pressed by the fixing member to thereby restrict the formation of a gap between the conductive member and the camera deco.

8. The electronic device of claim 2, wherein an inside of the camera deco comprises a recess and at least a portion of the conductive member is disposed in the recess.

9. The electronic device of claim 2, wherein the conductive member is disposed adjacent to an edge of the camera deco and formed to protrude in a direction opposite to the rear plate.

10. The electronic device of claim 2, wherein the conductive member comprises an elastic material.

11. The electronic device of claim 2, wherein the printed circuit board is disposed adjacent to the support bracket.

12. The electronic device of claim 11, wherein at least a portion of the printed circuit board is formed to surround at least a portion of the fixing member.

13. The electronic device of claim 11, wherein the printed circuit board is spaced apart from the conductive member.

14. The electronic device of claim 1, wherein the support bracket comprises a first area and a second area partitioned from the first area, and
wherein the camera assembly and the printed circuit board are disposed in the first area and a battery is disposed in the second area.

15. The electronic device of claim 1, further comprising:
a display disposed in the housing, facing a direction opposite to the rear plate; and
a battery disposed in an area partitioned from the printed circuit board.

16. An electronic device, comprising:
a housing comprising a rear plate including an opening and a camera deco disposed in the opening to be exposed to an outside of the electronic device and connected to the rear plate;
a support member disposed in the housing;
a printed circuit board disposed in one area of the support member;
a camera assembly covered by the camera deco and configured to capture an external object through at least one opening formed in the camera deco;
a fixing member coupled to the support member and configured to fix the camera assembly and/or the printed circuit board to the support member; and
a conductive member at least partially disposed between the camera deco and the fixing member to electrically connect the camera deco and the fixing member.

17. The electronic device of claim 16, wherein the electronic device further comprises:
a rear structure supporting the camera assembly and the printed circuit board, wherein the fixing member is coupled to the rear structure to fix the camera assembly and/or the printed circuit board to the support member.

18. The electronic device of claim 17, wherein the fixing member is disposed to extend through a portion of the rear structure to an inside of the support member.

19. The electronic device of claim 17, wherein the electronic device is configured to form a discharge path from the camera assembly to the printed circuit board through the camera deco, the conductive member, the fixing member electrically connected to the conductive member, and the support member.

20. The electronic device of claim 16, wherein at least a portion of the fixing member and the conductive member is disposed to be in contact with each other.

* * * * *